United States Patent

[11] 3,609,406

[72] Inventor Terry R. Walther
Sunnyvale, Calif.
[21] Appl. No. 11,565
[22] Filed Feb. 16, 1970
[45] Patented Sept. 28, 1971
[73] Assignee Electronic Arrays Inc.
Mountain View, Calif.

[54] INTEGRATED CIRCUIT INVERTER
12 Claims, 7 Drawing Figs.

[52] U.S. Cl. .......... 307/251,
307/221, 307/279, 307/303, 307/304
[51] Int. Cl. .......... H03k 17/60
[50] Field of Search .......... 307/205,
251, 279, 304, 303

[56] References Cited
UNITED STATES PATENTS
3,383,570 5/1968 Luscher .......... 307/279 X
3,506,851 4/1970 Polkinghorn et al. .......... 307/251
3,514,765 5/1970 Christensen .......... 307/251 X

*Primary Examiner*—John S. Heyman
*Attorney*—Smyth, Roston & Pavitt

ABSTRACT: A push-pull inverter is disclosed with MOS-FET devices; a pair of FET's is connected between two terminals, the function serves as output. One FET of the pair has its gate connected to a pulse•source through a capacitor and to the drain electrode another FET device which may be partially incorporated in the other one of the pair. The latter device has common grounded source and common gate to receive input. Two of such inverters can be cross coupled to establish a bistable device, or they can be serially connected as doubly inverting buffer, operated in either case by a common clock. Two such inverters can be serially connected and operated by alternating clocks and with coupling circuitry interposed for node separation to establish a shift register stage.

PATENTED SEP 28 1971 3,609,406

INVENTOR.
Terry R. Walther

By Smyth, Roston & Pavitt
ATTORNEYS

INTEGRATED CIRCUIT INVERTER

The present invention relates to improvements for integrated circuits and more particularly to improvements of integrated circuits of the so-called MOS type.

Recently integrated circuits have been developed in which a chip of semiconductive material is provided with an insulating layer, for example, a layer of an oxide of the material used as semiconductor; so that the active electric circuit components provided in the semiconductive material can be constituted as field effect transistors with insulated gate. In particular, the transistors are established in the semiconductive material as small, so-called channels underneath an incremental proportion of the insulating layer. Such a channel is defined by a rather weakly doped semiconductive material portion bounded by two heavily doped regions forming PN junctions with the substrate including the channel portion thereof, but they make direct (ohmic) contact with separated lead-in electrode layering for establishing so-called drain and source electrodes. Such an electrode layer is likewise provided above the insulating layer above the channel for providing gate controlling potential.

Within the circuit pattern established on an integrated circuit chip, and using this type of field effect transistor, some drain and 27 some source regions therein are connected to gate electrodes of other transistors, through electrode layers, which are external to the semiconductor substrate itself. Whenever the transistor, to which the source or drain electrode pertains, is nonconductive that drain or source electrode together with the gate electrode of the other transistor establishes a so-called capacitive node which is capable of holding an electrostatic charge relative to the environment and particularly relative to the grounded substrate of the chip and for a certain period of time which is long, when compared with operating and clocking periods and phases of the circuit as a whole.

The integrated circuit, MOS chip, therefore, is essentially a pattern of nodes, particularly distributed within a semiconductor body, and circuit operation involves primarily charging and discharging of such nodes, including particularly the copying and/or the transfer of a charge (or absence of a charge) in one node to a different node and in accordance with the particular processing pattern.

Pursuant to such operations it is essential, of course, that electric power be applied to the integrated circuit chip. The conventional MOS integrated circuits, therefore, include in many instances two or more MOS transistors coupled in series, drain to source electrode connection, and further connected between ground and a source of voltage potential, which is positive or negative depending upon the type of conductivity used in the integrated circuit chip. As all of such transistors connected in series may be conductive at the same time, it is necessary that a relatively large impedance is included in this circuit. Such an impedance is usually provided by selecting the channel impedance of one of the transistors in the conducted state to be rather high. The conductivity in the several channels of different transistors and on a per unit length basis, is usually the same, so that a relatively high impedance for a channel is provided through choosing relatively long dimensions for the channel.

The junction between two such series connected and possibly concurrently conductive transistors may have to change potential between an operating level and reference or ground potential. This operational requirement makes it necessary that impedance ratio values of two such series connected transistors is rather high for obtaining transfer of charges at sufficiently high voltages from one node to another, or to establish a particular charge in a particular node before it is transferred, etc. Again, this requires one of the channel impedances to be rather high, and the channel to be relatively long.

The invention herein disclosed is related to particular circuitry within an integrated circuit chip in which there is no need for a particular impedance ratio of the several field effect transistors involved. Moreover, the circuit to be established in accordance with the invention is constructed in such a manner that a DC supply source is in fact not needed, but power can be furnished in conjunction with and by operation of clock pulses fed to the integrated circuit chip as a whole for operation control and synchronization. In addition, transistors connected between that source of power and the source of reference potential are never simultaneously conductive.

In order to understand the invention and in order to appreciate fully the intended operations to be performed within the integrated circuit chip it has to be appreciated that, for example, within a circuit pattern, two transistors may appear connected directly with their drain electrodes or in a drain-to-source connection. If these transistors are located in physical proximity, the two electrodes may, in effect, be established by a single, heavily doped region adjacent to which terminate, for example, two separate channels. Conversely, if a circuit requires that two separate gate electrodes, pertaining to two different transistors (for controlling two different channels) are to be interconnected, and if the two transistors are also located in close proximity to each other, a single gate electrode layer may in effect be used, cooperating with two different channels. It can readily be seem, that this way, significant savings in space is obtained on the chip.

The circuit in accordance with the present invention establishes basically a new inverter which permits strict push-pull operation without requiring a particular impedance ratio of the transistors operated in push-pull. The transistors can, therefore, have minimum size The inverter can be interconnected with others of similar type to establish a digital, bistable switching device, a buffer, or a shift register.

In accordance with the preferred embodiment of the present invention there is provided a first, insulated gate, field effect device with source electrode connected either to a source of DC power or to the clock pulse source operating the system. The source electrode of the field effect device is connected to the drain electrode of another field effect device; in effect, they may share the same doped region which establishes also the output of the inverter. This other field effect device has a channel and a source electrode connected to ground. The gate of the first mentioned transistor is connected to a clock pulse source through a capacity established within the integrated circuit chip. The gate of the second field effect device is connected to receive the external logic signal, external, that is to the inverter presently described. Another field effect device, broadly speaking, is connected with its source electrode to ground and may share the source electrode with the second one of the field effect devices mentioned. The gate of this additional field effect device is connected likewise to receive the external pulse and may share the gate with the second field effect device. Only the drain electrode of that additional field effect device is not shared with any element of the second field effect device but is connected to the gate of the first transistor.

In realizing the second field effect device and the additional field effect device, it was found that novel construction can be used in that actually these two field effect devices do not only share gate electrodes but they can also share to some extent the same channel, and two different drain electrodes connect to different portions of that channel. The essential function realized is that the two drain electrodes are in effect operatively interconnected whenever the common gate renders the channel means, a single channel or both channels depending upon the geometry, conductive, so that the two drain electrodes in effect have similar potential, which in essence is ground or reference potential. On the other hand the two drain electrodes of the second and of the additional field effect device as described are to assume independently different potentials whenever that common gate provides a potential so that the associated channel means is nonconductive.

The circuit in essence does not consume any DC power in the strictest sense, the only power it consumes involves flow of transient current through the capacitor. When the logic signal applied to the circuit is different from ground to render those two field effect devices (which is a composite device having two channels, or having a common channel but always having two separate drain electrodes) conductive, the capacitor is charged so that the transistor having its gate electrode connected to the capacitor is at ground potential for keeping this transistor in the off state. As the composite FET device is conductive it applies ground to the output of the inverter.

In case the inverter input signal is essentially ground potential, the two or the common channel of this composite field effect device is maintained nonconductive, and its two drain electrodes are disconnected; the capacitor renders the first mentioned transistor conductive, and operating voltage from the clock channel or the DC bias is applied to the inverter output.

If one uses two such inverting devices with cross-coupled outputs and inputs, a very simple flip-flop is in fact established. If one interconnects two such inverting devices in that the output of one is connected directly to the input of the other one, and if a signal is fed to the input of the first one, than a doubly inverting buffer amplifier with two stages is established, responding to a common clock.

In accordance with a different example, tow of such inverters can be connected in series, but with a coupling transistor connected in between the output of the one inverter and the input of the next one or with an isolation transistor between the drain and source electrodes interconnected directly in the other examples. If the two inverters are operated with alternating clocks, a single bit storage facility for a shift register is provided.

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Figures 1, 2, 3, 4, 5, 6, 7:
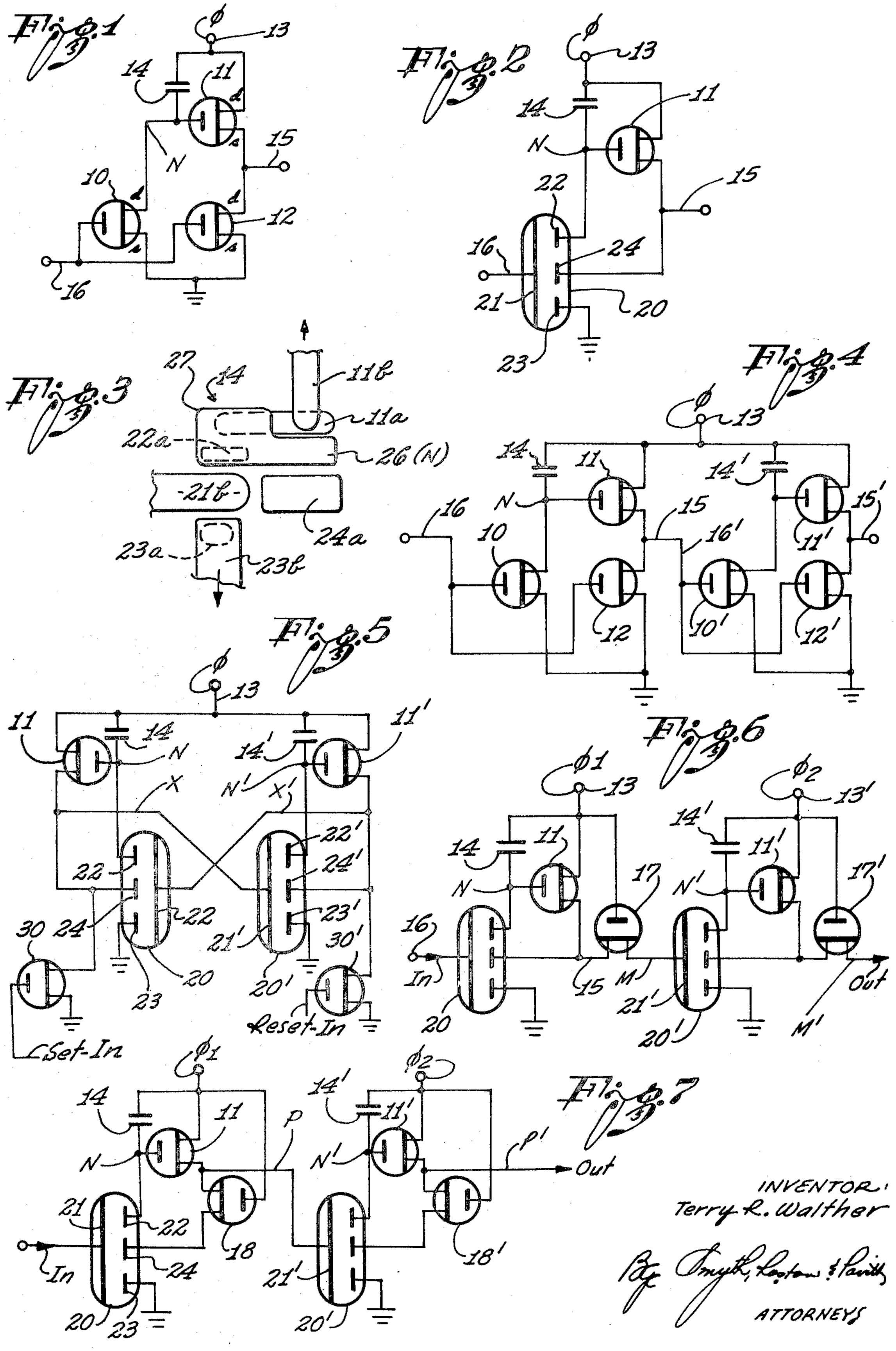
FIG. 1 illustrates a circuit diagram showing a first embodiment of the present invention.
FIG. 2 illustrates a slightly modified version of the circuit shown in FIG. 1.
FIG. 3 illustrates a plan view of the MOS chip geometry, as a representative example, for the circuit shown in FIG. 2.
FIG. 4 illustrates an amplifier using two circuits of the type shown in FIG. 1.
FIG. 5 illustrates schematically a circuit diagram for a bistable device using two cross coupled circuits of the type shown in FIG. 2.
FIG. 6 illustrates a shift register stage using two interconnected circuits shown in FIG. 2 with a biphase clock.
FIG. 7 illustrates a modified shift register stage.

Proceeding now to the detailed description of the drawing, in FIG. 1 there is illustrated a first embodiment of a push-pull ratioless inverter incorporating the features of the present invention. The circuit illustrated is presumed to be a component on an integrated circuit chip. For reasons of conveniently explaining the invention, it is assumed that the transistors employed in the circuit are P channel, MOS, insulated gate field effect transistors. The principles are equally applicable to other structures, particularly to structures using N channel MOS circuits. Also, it is presumed that the field effect transistors are operated in the enhancement mode.

The term "ratioless" is to mean that transistors connected in series to each other within the circuit and across two sources of operating potentials do not have to have particular impedance ratios but can have minimum impedance individually, which, as far as integrated circuit techniques is concerned, amounts to selection of minimum size dimensions for each of such transistors.

The circuit shown in FIG. 1 includes in particular three MOS insulated gate field effect transistors 10, 11 and 12, each having drain electrode (d), source electrode (s) and gate electrode (g). The two transistors 11 and 12 are operated in push-pull, but they are connected drain-to-source electrodes for establishing the output terminal 15 of the inverter. Transistor 11 and 12 actually share a heavily P-doped region to establish source electrode of one and drain electrode of the other.

The input terminal 16 of the inverter is connected to the two gate electrodes of transistors 10 and 12. The source electrodes of transistors 10 and 12 are interconnected, and they connect to a reference potential such as ground. The drain electrode of transistor 11 is connected to a terminal 13 to receive a clock or phase pulse Φ.

It is a specific feature of the invention that the circuit does not dissipate any DC power. Negative DC power could be applied in lieu of clock to the drain electrode of transistor 11, but it is a specific advantage that the circuit as a whole can be operated merely by supplying pulsating power, namely the pulses Φ. Capacitor 14 connects the gate electrode of transistor 11 to the pulse source. The capacitor 14 may, for example, be established by extending the gate electrode layer over a thin region of silicon dioxide, a portion thereof serving for gate insulation. Additionally the particularly doped zone, in this case a P-zone, forming the drain electrode is extended, away from the channel region, to extend underneath that extended gate electrode, so as to constitute an additional capacitor 14. The capacitor, however, is to be selected rather small, because as will be developed below, power is consumed in the system essentially only as to charge and discharge of this capacitor. Finally the drain electrode of transistor 10 is connected likewise to the gate of transistor 11. This particular junction establishes a node N.

The circuit operates as follows. If the input signal in line 16 is a logical "zero" assumed to be represented by ground or approximate ground potential, transistors 10 and 12 are rendered nonconductive and will remain nonconductive. As long as terminal 13, intermittently receiving signal Φ, is at ground or approximately ground potential no operating voltage is applied between source and drain electrodes of transistor 11, and, therefore, the transistor is likewise nonconductive.

As terminal 13 receives a pulse Φ and is taken negative at a steep rate, the voltage across capacitor 14 will not change instantaneously so that the node N is likewise taken negative. Thus, transistor 11 is turned on because its gate is rendered negative by operation of capacitor 14. As node N is not conductively coupled to any source of power it will charge only through leakage paths. As transistor 11 conducts it provides a negative output to the terminal 15, i.e., in effect it couples the negative phase signal Φ to the line 15. As transistor 11 has minimum impedance, line 15 is taken to a negative level which is only slightly less negative than the level of phase signal Φ. Moreover, there is little or no power consumption in the low-impedance current path between terminal 13 and line 15, and the output signal level does not depend on any particular impedance ratio of transistors 11 and 12 because transistor 12 is nonconductive. There is, therefore, an inversion in that the output provided by the inverter in response to a logic "zero" as input signal, is a negative signal equivalent to a logical "one." Output line 15 may lead into another storage node, which is charged by and through the clock signal Φ.

Assuming the input at terminal or line 16 is taken negative, equivalent to a logic "one," transistors 10 and 12 are both rendered conductive. As the clock signal Φ 1 taken negative, node N will still be taken negative at first, because the voltage across capacitor 14 cannot change instantaneously. Node N, however, will quickly discharge through transistor 10, so that node N assumes ground potential and the negative clock pulse voltage appears across capacitor 14. This, in turn, means that the leading edge of the signal Φ tends to turn transistor 11 on, but the gate of transistor 11 rather quickly assumes ground potential equivalent to a turning off state for the transistor 11. On the other hand, transistor 12 is rendered conductive directly by the logic "one" input signal, while transistor 11 is nonconductive, so that the output taken from line 15 is approximately ground level, again without depending on the voltage divider ratio of transistors 11 and 12 in their conductive states.

It is, therefore, apparent that there is full push-pull operation. Transistor 11 and 12, as serially connected between the clock line and ground, alternate in the state of conduction in dependence upon the input signal level as applied to line 16. During periods in between phase pulses Φ the output 15 has value which depends on further connection of output line 15 and whether or not such connection leads to a node. If input terminal 16 has received a logic zero during a phase time Φ, node line 15 may be charged as was outlined above. That charge level should not be changed during the period in between two such pulses Φ. Thus, the input in line 16 should not change during that period. A deviation from this rule will be discussed below with reference to FIGS. 6 and 7.

Turning now to FIG. 2, there is illustrated a different embodiment of the present invention. The figure provides a minimum geometry circuit in that in effect there are only two MOS transistor devices, however, one of them is of a special kind as will be developed shortly. Corresponding parts are denoted with similar reference numeral, i.e., the circuit has also an input line or terminal 16 and an output line 15. The pulse or clock line 13 for receiving the signal Φ is connected to the drain electrode of transistor 11 having drain and gate electrodes interconnected by the capacitor 14.

The additional transistor-active element is established by a circuit 20 which is a three main electrode MOS field effect transistor. The circuit is constructed in many parts similar to a regular FET, i.e., it has a gate electrode 21 which is a conductive layer increment on top of a thin layer of silicon dioxide which, in turn, is placed on top of a channel within a chip of semiconductive material. One can also say that there are regular drain and source electrodes, respectively denoted 22 and 23. However, the circuit is designed in addition that next to the channel, inside of the semiconductive chip, there is provided an additional doped zone, analogous exactly to drain and source electrodes but which in essence monitors the half way potential in the channel for reasons of its symmetrical disposition between drain and source electrodes. This third main electrode is denoted with reference numeral 24; by virtue of operation and employment, electrode 24 is actually a second drain electrode.

The disposition of the zones defining the three electrodes within a chip, however, is of a kind that either one of the electrodes 22, 23 and 24 can function as drain, the other two being sources, or either can function as a source, the others as a drain. In the present situation drain electrode 22 connects to node N, while drain electrode 24 connects to and actually establishes output line 15; source electrode 23 is grounded.

FIG. 3 illustrates somewhat schematically the layout of an incremental portion of an integrated circuit chip of the MOS type showing particularly the layout of the inverter as shown schematically in FIG. 2. As it is presumed that the MOS-IG-FET operates with P-channel enhancement, it follows that the main body is of N type conduction having heavily doped zones with P conductivity such as denoted with reference numerals 22a, 23a, 24a. These zones respectively establish the two drain electrodes 22 and 24 and the source electrode 23. An electrode layer plating increment 23*b* makes ohmic contact with zone 23*a*, and connects that zone to the ground bus of the chip.

An electrode layer plating 21*b* actually establishes gate electrode 21 and is disposed above the channel extending between zones 22*a* and 23*a*. Another electrode layer plating 26 makes metallic contact with the P-zone 22*a*, but it extends also above the channel of the transistor 11 to establish the gate electrode thereof. The channel of transistor 11 is bounded by the two P-type zones 11*a* and 24*a*. The P-zone 11*a* is now extended beyond that particular region bounded by the channel between zones 11*a* and 24*a*, to extend underneath a portion 27 of the electrode plating 26 but separated therefrom by a thin silicon dioxide layer to establish the capacitor 14. A metallic layer plating portion (not shown) may make metallic ohmic contact with the zone 24*a* defining drain electrode 24 to define output terminal 15. The zone 11*a* defining the drain electrode of transistor 11 makes ohmic contact with a metallic layer plating 11*b* which defines in essence terminal 13.

It can, therefore, be seen, that the circuit of FIG. 2 is established by four zones and two channels; the configuration results in one regular FET, one-three-main-electrode FET, and one capacitor. The isolated plate 26 establishes the node N. Device 20, in particular, is established by a common channel which extends from the P-zone 23*a* to the two P-zones 22*a* and 24*a*, and that common channel runs underneath a thin silicon dioxide layer having on top a metallic electrode plating 21*b* to which is applied the gate control voltage. The two P-zones 22*a* and 24*a* *are at floating potential if the channel underneath the electrode 21 is nonconductive; the two zones 22a* and 24*a* are at ground potential when the channel conducts, as zone 23*a* is assumed to be permanently grounded.

Operation of the device shown in FIGS. 2 and 3 follows in direct analogy to the operation of the circuit shown in FIG. 1. Assuming ground potential, or near ground potential, is applied to line 16 when pulse Φ takes terminal 13 negative, then the entire arrangement 20 is nonconductive. Node N is not taken to ground, but capacitor 14 transmits a negative voltage directly to the gate of transistor 11 rendering the transistor conductive for coupling the line 13 to output 15 which is taken negative. As the device 20 operates in effect as a capacitor, at a very high impedance, there is little or no current flowing through the channel of the device 20; and electrode 24 thereof is free to follow that potential drop to a negative level. A negative signal is derived from line 15 in response to a ground potential input. If the line 15 is or leads to a node, that node will be charged, and its charge will remain until replenished or discharged with the next phase pulse.

Assuming negative voltage equivalent to a logic "one" is applied to line 16, then the entire device 20 is rendered conductive. At pulse time Φ, node N tends to follow the negative drop, and current flows from electrode 22 to electrode 23 discharging the node N to ground potential. Transistor 11 is maintained in the nonconductive state. As the channel of device 20 is conductive electrode 24 is taken to ground. This means that line 15 is coupled to ground. If the line 15 is a charged node, line 15 discharges via electrode 24 and through the same conductive channel in device 20. Subsequently, line 15 is maintained at ground potential.

It has to be emphasized now that the circuits of FIGS. 1, 2 and 3 do not depend on any impedance ratio as far as transistors 11 and 12 or 20 are concerned when in the conductive state. Each can be provided for minimum impedance with minimum dimension win an MOS array. The device is designed, so that current does never flow from terminal 13 to ground. Current can flow to charge the capacitor 14 and current may flow into line 15 when a node. The only power consumed in the devices themselves is the transient current drawn through capacitor 14. Since this capacitor is small, the power consumption is small accordingly. Power consumption is directly proportional to phase pulse frequency, as the transient current through capacitor 14 can flow only when negative signal Φ appears at terminal 13.

The device operates in push-pull operation even though the two output devices may be structured differently, as in the case of FIG. 2. Nevertheless, electrodes 24 and 23 together with the gate 21 establish functionally the push-pull counterpart to the MOS device 11, and together they do perform push-pull operations; one logical signal is processed to render one of the two channels involved conductive while the other one remains nonconductive; for the complementary logic input the situation will reverse.

Turning now to FIG. 4 there is illustrated a first specific embodiment showing two inverters of the type shown in FIG. 1 and interconnected in series as far as operational connection is concerned. The several components are denoted with the same reference numerals used in FIG. 1 for the one stage, while the second stage has its component identified by analogous reference numerals with a (') added to each of them to show corresponding parts. Detailed explanation of the circuit is not necessary at this point because the description of each section thereof is identical to the description of FIG. 1. There is one difference, however, namely, the output 15 is in effect identical with or connected to the input 16' for the second stage.

It is an important aspect that double inversion, i.e. direct signal amplification or signal transfer at complete isolation is obtainable between principle input 16 and principal output 15' of the double inverter, and again simply by operation of the same signal Φ. Assuming a negative voltage prevails in line 16 during a pulse time Φ then transistor 12 is grounded as was started, and line 15 is likewise grounded, connecting the gate electrode of transistor 10' to ground. As a consequence, transistor 10' remains nonconductive and transistor 11' is rendered conductive by the same signal Φ because the capacitor 14' has coupled a negative turn-on pulse to the gate of transistor 11'. Therefore the output line 15' of the system is operatively coupled to the signal line 13 providing negative output voltage which results from double inversion.

The operational state of the device in response to a negative input at 16 and in further response to a signal Φ is as follows: transistors 10 and 12 conduct, node N discharges, transistor 11 remains nonconductive, line 15 is clamped to ground, and transistors 10' and 12' are nonconductive, so that node N' is taken negative. Transistor 11' is conductive applying negative going voltage to line 15'. Thus, there is a negative output for a negative input. The output in line 15' will remain negative, subsequent to a signal Φ but only when connected to an isolated node. For a ground potential input the status of conduction is reversed, whereby particularly lines 15–16' operates as a node, capable of retaining a negative voltage charge. Finally, it should be mentioned that the buffer can be constructed by two serially connected inverters of the type shown in FIGS. 2 and 3.

FIG. 5 illustrates an embodiment of the invention but utilizing two cross-coupled inverters of the type shown in FIG. 2 and establishing, therefore, a device which in effect can be regarded a minimum size flip-flop or electronic storage cell to the bit level. The flip-flop is comprised of two such three-main-electrode FET devices 20 and 20' respectively connected to regular FETs, 11 and 11' as outlined with reference to FIGS. 2 and 3, there being capacitors 14 and 14' accordingly. The phase signal input terminal 13 is common to transistors 11 and 11' as well as capacitors 14 and 14'. There are provided the following interconnections; the source electrode of transistor 11 forms a node X together with the gate 21' of the device 20'. For reasons of symmetry the source electrode of transistor 11' as connected to gate 21 of device 20 forms therewith a node X'. Nodes N and N' exist analogously to the nodes N in FIGS. 1, 2 and 3.

Such a device is capable of maintaining a stable flip-flop state as can be following from the following. It may be assumed that the node X holds a negative charge, while node X' is at ground potential. It is, of course, entirely arbitrary whether this constitutes the set or the reset state of the flip-flop. Under these conditions it is now assumed that the signal Φ is taken negative.

A negative charge in node X prepares always device 20' to the conductive state while the ground level in node X' prepares and maintains device 20 for nonconduction. The negative swing of the phase signal Φ is transferred to electrode 22' of device 20' via capacitor 14'. Therefore, the node N' is discharged and coupled to ground potential. This, of course, may merely be a repetition of previous operations in that the node N' is already discharged. Essential is that the conductive channel in the device 20' is at ground potential and that in turn provides ground potential to the line X' assumed to exist thereat. The transistor 11' therefor remains nonconductive so that node X' is not charged.

Looking now at the other side of the device, the negative signal Φ from line 13 passes through capacitor 14 to the gate of transistor 11. Line X is assumed to have a negative charge, therefore, the transistor 11 is rendered conductive, and the negative charge of the line X is replenished. Transistor 20 remains nonconductive by operation of its grounded gate which ground potential is reinforced by the state of conduction of device 20'. It, therefore, appears that the charge in line X is replenished and any residual charge in node X' is removed, thus reinforcing the particular state of the flip-flop.

For reasons of symmetry, it is, of course, apparent that if node X' holds a negative charge while node X is at ground potential, reinforcement of that state occurs at exactly the same way, the state of conduction of the various transistors and transistor devices involved is simply reversed. The element, therefore, is a minimum size, digital data storage cell to the bit level.

Now it must be described that the device can also change state. There are, for example, provided additional FET's, 30 and 30', responding to external gating signals which are set and reset signals, possibly phased so as to concur with phase signal Φ for selectively discharging node X or X' for respectively resetting or setting the flip-flop. Assuming again that node X is charged and node X' is discharged, it may now occur that through external control node X is discharged and clamped to ground at the next pulse Φ. Then it appears that both devices 20 and 20' are prepared for nonconduction. However, the following transpires.

As soon as the signal Φ is taken negative transistor 11' is rendered conductive and node N' is taken negative because device 20' is maintained nonconductive. Moreover, the source electrode of transistor 11' goes negative and the to discharge X' begins to charge negatively, thus, rendering the device 20 conductive and coupling node N to ground. Concurrently, thereto, there was the tendency for transistor 11 to turn on, but discharge of node N inhibits this. For this operation, however, it is important that the external signal as applied to line X is maintained during this operation for inhibiting device 20' from becoming conductive, so that node X' can change potential for rendering transistor 20 conductive. It follows, that a change of state of the flip-flop is induced by causing the charged node (X or X') to discharge and to inhibit its recharge during phase pulse time so that, by virtue of the particular design, the respective other node is being charged. Subsequent phase pulses operate as refresher control for the charged one of the respective node, X or X'.

Outputs can be taken from the flip-flop by copying the content of nodes X and X', preferably at phase times Φ during which period the charged one of the two nodes has its charge replenished. Finally, it should be mentioned that the flip-flop of FIG. 5 can be constructed by two cross-coupled inverters as shown in FIG. 1.

Turning now to the description of FIG. 6, there is illustrated how two inverters of the type shown in FIG. 2, each having a three-main-electrode transistor device, can be used to establish a single stage or bit cell in a shift register. It will be apparent, that inverters of the type shown in FIG. 1 can be used analogously in this circuit. The devices 20, 14, 11 are interconnected as was explained with reference to FIGS. 2 and 3, and there is a similar inverter constructed of devices denoted with reference numerals 20', 14', and 11'. However, the two inverters have separate clock terminals, 13 and 13', and they receive different clock pulses, Φ1 and Φ2. The entire arrangement of which the circuit of FIG. 6 is a part, is assumed to be operated by alternating pulses Φ1 and Φ2.

The output line 15 connects to an additional, isolation transistor 17, particularly to the drain electrode thereof, while the source electrode connects to gate 21' of device 20'. The gate electrode of transistor 17 receives the same phase signal as the drain electrode of transistor 11 which, in this case, is signal Φ1. The source electrode of transistor 17, not connected to line 15, establishes a node M together with the gate 21' of device 20'. The node M is not directly affected by the state of conduction of device 20 and by the potential of electrode 24 thereof, except during phase times Φ1. The device which includes the components 11', 20', etc. has an output isolation transistor 17' analogously connected by its source electrode to output line 10' and having its gate connected to terminal 13' to receive phase signal Φ2.

Assuming line 16 has a negative voltage rendering device 20 conductive, particularly when Φ1 is negative, node N is discharged and transistor 11 is maintained in the nonconductive state. The line 15 is connected to ground through conduction of device 20. As the gate of transistor 17 receives negative signal Φ1, that coupling transistor is rendered conductive, and the digital storage node M is discharged and coupled to ground. (For this operation the electrode of transistor 17 coupled to node M is actually the drain electrode). The next phase signal is Φ2, succeeding Φ1 when terminal 13 is at ground level. As Φ2 is taken negative device 20′ is nonconductive, because node M was previously discharged. Transistor 11′ is, therefore, rendered conductive. Accordingly, the drain electrode of conductive transistor 17′ is taken negative. That drain electrode may lead to a gate of the next stage (an input line analogous to line 16) and establishing an interregister stage node M′ which is now charged.

It can thus be seen that a signal applied to line 16 is inversely copied into node M during a pulse time Φ1, while the charge content of node M is inversely copied into node M′ at the respectively succeeding pulse time Φ2. The coupling transistor 17, for example, prevents changes in potential in line 16 (which may be an output node analogous to M′ and pertaining to a preceding register stage) at a phase time Φ2 from affecting the charge state and logical content of node M. Particularly the potential in line 15 is free to change subsequent to a pulse Φ1 without affecting node M.

FIG. 7 illustrates a shift register, again constructed from inverters as shown in FIG. 2, but inverters as shown in FIG. 1 can be used analogously. Generally, the circuit in FIG. 7 is comprised of two inverters which are serially connected via a coupling transistor, to isolate the principal storage node (M) of this register stage from the first inverter stage (element 11, 14 and 20), after the charge state of the node M has been determined during a pulse time Φ1 in accordance with the input applied to line 16 at that time. The circuit shown in FIG. 7 provides isolation of the principal storage node of this register stage, called here node P′, in a somewhat different manner.

As far as an individual inverter stage is concerned, all of the elements shown in FIG. 2 are included, but in addition, a transistor 18 is interposed between the drain electrode 24 of device 20 and the source electrode of transistor 11. This transistor 18 receives at its gate the phase signal Φ1. Analogously, a transistor 18′ has its drain-to-source path connected between the source electrode of transistor 11′ and the drain electrode 24′ of a device 20′. The principal storage node P of this register stage is established by the gate 21′ of the device 20′ and by the two interconnected main electrodes of transistors 11 and 18 (which may be comprised of a single electrode defining region in the chip). Analogously, the output or interstage coupling node P′ is connected to the interconnected electrodes of transistors 11′ and 18′.

An individual inverter stage in the circuit operates as follows. Assuming a negative voltage is applied to line 16 for rendering device 20 conductive, node N discharges and the source electrode of transistor 18 is grounded. As Φ1 is taken negative, node P is discharged but decoupled from the remainder of that input stage after Φ1 has decayed. Node P thus remains independent from subsequent changes in the input line 16 for device 20, for example, during the sequential pulse time Φ2.

In case ground potential prevails in line 16 during a signal Φ1, or prior thereto, device 20 remains nonconductive. As Φ1 is taken negative transistor 11 becomes conductive as aforedescribed. The fact that transistor 18 becomes likewise conductive, is immaterial for this operation, because device 20 is nonconductive and electrode 24 is thus not operated as a source. Thus, node P is permitted to charge, and that charge will remain until subsequent pulse time Φ1.

During interspaced pulse or phase time Φ2, the content of node P is invertedly copied into output node P′ of this register stage in an analogous operation.

The invention is not limited to the embodiments described above but all changes and modifications thereof not constituting departures from the spirit and scope of the invention are intended to be included.

What is claimed is:

1. In an integrated circuit constructed for insulated gate operation and having conductivity control in particular channels by operation of field effect, the combination comprising:

first means defining at least one source electrode connected to receive reference potential;

second means defining channel means extending from the first means, a first and second drain electrode coupled to the second means and being insulated from each other except for conduction through the channel means of the second means;

third means including at least one gate electrode means disposed in relation to the channel means, and connected to receive selectively a control signal variable between a reference potential, and potential for controlling conduction through the channel means of the second means at a different level of conduction than conduction resulting from application of reference potential;

fourth means defining a field effect transistor having a gate electrode connected to the first drain electrode and having a source electrode connected to the second drain electrode;

fifth means defining a capacitance between the gate electrode and the drain electrode of the transistor of the fourth means, essentially unaffected by the conduction of the transistor of the fourth means; and sixth means for biasing the drain electrode of the transistor of the fourth means and for controlling the conduction thereof, and including means connected to the capacitor to apply thereto clock phase pulses at a potential different from the reference potential.

2. In a circuit as in claim 1, the second means defining two channels, the third means defining at least one electrode above the two channels to operate the two channels in response to the same control signal, the first and second drain electrodes connected individually to the two channels.

3. In a circuit as in claim 1, there being a single channel defined by the second means, the first and second means coupled to different portions of the channel.

4. In a circuit as in claim 1, and including seventh through twelfth means respectively corresponding to the first through sixth means and including third and fourth drain electrodes respectively corresponding to the first and second drain electrodes, the gate of the third means connected to the fourth drain electrode establishing a first node, the gate of the ninth means connected to second drain electrode establishing a second node, the combination establishing a bistable device; and means to provide charge drainage for control selectively to the first or to the second node.

5. In a circuit as in claim 1 and including seventh through twelfth means respectively corresponding to the first through sixth means and including third and fourth drain electrodes respectively corresponding to the first and second drain electrodes, the gate of the third means connected to the fourth drain electrode to establish a buffer for shifting a signal applied to the gate of the ninth means to become derivable from the source-to-second drain connection thereof.

6. In a circuit as in claim 1 and including seventh through twelfth means respectively corresponding to the first through sixth means and including third and fourth drain electrodes respectively corresponding to the first and second drain electrodes, the sixth and twelfth means respectively receiving alternating clock pulses; an interstage linking transistor having its gate connected to the sixth means and having its source-to-drain path connected between the second drain electrode and the gate of the ninth means; and an output transistor having its gate connected to the twelfth means and its drain electrode connected to the fourth drain electrode.

7. In a circuit as in claim 1, the connection between the second drain electrode and the source of the transistor of the fourth means including the drain-to-source path of another transistor having its gate connected to the sixth means.

8. The circuit as in claim 7 being one of a plurality of serially connected ones of similar layout to establish a shift register.

9. In an integrated circuit constructed for insulated gate operation and having conductivity control in particular channels by operation of field effect, the combination comprising:

first means means defining an FET channel, there being three, electrode-defining zones adjacent this channel;

a gate electrode above the channel capacitively coupled thereto;

second means defining a second FET channel extending between a drain-electrode-defining zone and a first one of the zones of the first means, the drain-electrode-defining means having an extended portion;

means defining a combined gate electrode and capacitor electrode extending above the second FET channel as well as above said extended portion and making ohmic contact with a second one of the three zones;

first means connected for applying reference potential to the third one of the three zones;

second means connected for applying control voltage to the gate electrode;

and third means connected for applying voltage pulses to the drain electrode of the defining zone including the extended portion thereof.

10. In an integrated circuit constructed for insulated gate operation and having conductivity control in particular channels by operation of field effect, the combination comprising:

a first, insulated gate device having gate means, first and second drain electrodes, means defining source electrode means and channel means extending from the source electrode means to the first and second drain electrodes past the gate means, the conduction through the channel means depending upon the voltage applied to the gate means;

means connected for applying control voltages as signals to the gate means to become effective in the entire channel means;

a second insulated gate device similarly constructed to the first device and having gate means, drain electrodes, source-electrode-defining means and channel means;

a coupling FET-type transistor having its channel and electrodes connected between the first drain electrode of the first device and the gate means of the second device;

first means connected for applying pulses of a first sequence as gating and drain signals respectively to the gate of a coupling transistor and to the second drain electrode of the first device;

second means connected for applying pulses of a second sequence phase shifted in relation to the pulses of the first sequence, as drain bias to the second drain electrode of the second device; and third means connected for deriving an output from the first drain electrode of the second device in synchronism with the pulses of the second sequence.

11. In a circuit as in claim 10, the first and second means each including an FET type transistor and a capacitor connected to the gate of the latter transistor and to the respective second drain electrode, the source electrode of the latter transistor connected to the respective first drain electrode, the drain electrode connected to receive biasing voltage, the respective capacitor connected for receiving pulses of the first or second sequence.

12. In a circuit as in claim 10, the first and second means each including an FET-type transistor and a capacitor respectively connected to the gate of the latter transistor, a transistor of the first means having its source electrode connected to the gate means of the second device, the transistor of the second means having its source electrode connected to the third means, the drain electrodes of the transistors of the first and second means connected for receiving biasing voltage, the respective capacitors of the first and second means connected to respectively receive the pulses of the first and second sequence.